US007002841B2

(12) United States Patent
Yoo et al.

(10) Patent No.: US 7,002,841 B2
(45) Date of Patent: Feb. 21, 2006

(54) MRAM AND METHODS FOR MANUFACTURING AND DRIVING THE SAME

(75) Inventors: In-Kyeong Yoo, Suwon (KR); Wan-jun Park, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/701,436

(22) Filed: Nov. 6, 2003

(65) Prior Publication Data

US 2004/0090822 A1 May 13, 2004

(30) Foreign Application Priority Data

Nov. 7, 2002 (KR) .................. 10-2002-0068768

(51) Int. Cl.
*G11C 11/34* (2006.01)
(52) U.S. Cl. ..................... 365/177; 365/179
(58) Field of Classification Search ........ 365/177, 365/179, 213, 232, 104, 97
See application file for complete search history.

(56) References Cited

U.S. PATENT DOCUMENTS 5,068,826 A * 11/1991 Matthews ............... 365/170
6,657,270 B1 * 12/2003 Kim et al. ............... 257/423
6,664,579 B1 * 12/2003 Kim et al. ............... 365/173

* cited by examiner

*Primary Examiner*—Thong Q. Le
(74) *Attorney, Agent, or Firm*—Lee & Morse, P.C.

(57) ABSTRACT

An MRAM having improved integration density and ability to use a magnetic tunneling junction (MTJ) layer having a low MR ratio, and methods for manufacturing and driving the same, are disclosed. The MRAM includes a semiconductor substrate having a bipolar junction transistor (BJT) formed thereon, a bit line coupled to an emitter of the BJT, an MTJ layer coupled to the BJT, a word line coupled to the MTJ layer, a plate line coupled to the BJT so as to be spaced apart from the MTJ layer, and an interlayer dielectric formed between components of the MRAM, wherein the MTJ layer is coupled to a base and a collector of the BJT, the plate line is coupled to the collector, and an amplifying unit for amplifying a signal while data is read out from the MTJ layer is coupled to the bit line, thereby allowing precise reading of the data.

30 Claims, 6 Drawing Sheets

MRAM AND METHODS FOR MANUFACTURING AND DRIVING THE SAME

BACKGROUND OF THE INVENTION

1. Field of the Invention

The present invention relates to a semiconductor memory device and methods for manufacturing and driving the same. More particularly, the present invention is directed to a magnetic random access memory (MRAM) and methods for manufacturing and driving the same.

2. Description of the Related Art

MRAM, which is one type of next-generation memory device, has properties of both DRAM and SRAM, and also has nonvolatile characteristics of a flash memory.

The conventional MRAM includes a MOS transistor and a magnetic tunneling junction (MTJ) layer, which are coupled to each other. Data is stored in the MTJ layer of the MRAM. In the conventional MRAM, a tunneling current that passes through the MTJ layer also passes through the MOS transistor. Therefore, a resistance of the MOS transistor restricts the selection of the MTJ layer. Accordingly, when the magnetic resistance (MR) ratio of the MTJ layer is kept low, the data recorded in the MTJ layer cannot be read out precisely, thereby limiting the effective use of a conventional MRAM.

SUMMARY OF THE INVENTION

It is a feature of an embodiment of the present invention to provide an MRAM capable of increasing the feasibility of using an MTJ layer having a low MR ratio and reducing a series resistance effect caused by a resistance of a MOS transistor in a conventional MRAM.

It is another feature of an embodiment of the present invention to provide a method for manufacturing the MRAM.

It is a further feature of an embodiment of the present invention to provide a method for driving the MRAM.

According to an embodiment of the present invention, there is provided an MRAM, which includes a semiconductor substrate, a bipolar junction transistor (BJT) formed on the semiconductor substrate, a bit line coupled to an emitter of the BJT, a magnetic tunneling junction (MTJ) layer coupled to the BJT, a word line coupled to the MTJ layer, a plate line coupled to the BJT so as to be spaced apart from the MTJ layer, and an interlayer dielectric (ILD) formed between components of the MRAM, wherein the MTJ layer is coupled to a base and a collector of the BJT, the plate line is coupled to the collector, and an amplifying unit for amplifying a signal while data is read out from the MTJ layer is coupled to the bit line.

In the MRAM described above, the MTJ layer may be coupled to a portion of the base and a portion of the collector that is adjacent to the portion of the base. Alternatively, in the MRAM described above, the MTJ layer may be coupled to a portion of the base and a portion of the collector that is spaced apart from the portion of the base. Other features of the embodiments of the present invention described above may include the bit line being a metal line; the BJT being an n-p-n-type transistor; the BJT being a Schottky junction transistor; the amplifying unit being a sense amplifier; and/or the MTJ layer having a low magnetic resistance ratio compared to an MRAM having a MOS transistor instead of the BJT.

Each of the various embodiments of the MRAM described thus far may further include a first conductive plug and a pad conductive layer disposed between the BJT and the MTJ layer, wherein the first conductive plug is coupled to the base and the collector of the BJT, the pad conductive layer contacts the first conductive plug, and the MTJ layer is formed on the pad conductive layer.

In addition, in the embodiments of the present invention described above, the pad conductive layer may be formed to traverse the bit line, and the MTJ layer may be formed over the bit line.

It is a feature of an embodiment of the present invention to provide a method for manufacturing an MRAM, the method including: forming a BJT on a semiconductor substrate, forming a bit line on the semiconductor substrate so as to contact an emitter of the BJT, forming an MTJ layer on the resultant structure where the bit line is formed, so as to be coupled to the BJT, forming a word line so as to be coupled to the MTJ layer, forming a plate line so as to be spaced apart from the MTJ layer and coupled to the BJT, and coupling an amplifying unit, which amplifies a data signal output via the bit line, to the bit line.

In the method for manufacturing the MRAM described above, forming the BJT on the semiconductor substrate may include forming a collector on the substrate, forming a base in the collector, and forming the emitter in the base. In the method described above, the bit line is preferably formed of a metal line.

In the method for manufacturing the MRAM described above, forming the MTJ layer on the resultant structure where the bit line is formed, so as to be coupled to the bipolar junction transistor, may include: forming a first ILD on an entire surface of the resultant structure where the bit line is formed, forming a first contact hole in the first ILD so as to partially expose the base and the collector, and forming a pad conductive layer on the first ILD so as to fill the contact hole, the pad conductive layer formed to traverse the bit line, and forming the MTJ layer on the pad conductive layer above the bit line.

In the method for manufacturing the MRAM described above, in an embodiment of the present invention, forming the first contact hole may include forming a contact hole for exposing a portion of the base and a portion of the collector that is adjacent to the portion of the base. Alternatively, in another embodiment of the present invention, forming the first contact hole may include simultaneously forming a contact hole for exposing a portion of the base and a contact hole for exposing a portion of the collector that is spaced apart from the portion of the base. Forming the pad conductive layer may include forming a first conductive plug for filling the first contact hole, and forming a conductive layer on the first ILD so as to contact the first conductive plug and to be disposed over the bit line.

In an embodiment of the present invention, forming the magnetic tunneling junction layer on the pad conductive layer disposed over the bit line may include forming a first ferromagnetic layer, forming an insulating layer on the first ferromagnetic layer, and forming a second ferromagnetic layer on the insulating layer.

In the method of an embodiment of the present invention, forming the word line so as to be coupled to the magnetic tunneling junction layer may include forming a second interlayer dielectric on the first interlayer dielectric covering the pad conductive layer and the magnetic tunneling junction layer, forming a via hole through the second interlayer dielectric so as to partially expose the tunneling junction layer; and forming a conductive layer on the second interlayer dielectric, wherein the conductive layer also fills the via hole.

According to an embodiment of the present invention, in the method for manufacturing an MRAM described above, forming the plate line so as to be spaced apart from the magnetic tunneling junction layer and coupled to the bipolar junction transistor may include forming a third interlayer dielectric on the word line, forming a second contact hole through the third interlayer dielectric and all layers below the third interlayer dielectric exposing a portion of the collector away from the pad conductive layer, filling the second contact hole with a second conductive plug, and forming a plate line to contact the second conductive plug, which is filling the second contact hole.

It is a feature of an embodiment of the present invention to provide a method of driving the MRAM described above, the method including recording a first data by applying current to the word line and the bit line, and recording a second data by applying current to the word line in an opposite direction to the direction in which current is applied to the word line and the bit line when the first data is recorded, and applying current to the bit line in any direction.

According to another embodiment of the present invention, in the method of driving the MRAM described above, during the recording of the second data, current is applied to the bit line in an opposite direction to the direction in which current is applied to the word line and the bit line when the first data is recorded. Alternatively, in the recording of the second data, current may be applied to the bit line in a same direction as the direction in which current is applied to the word line and the bit line when the first data is recorded. In the method of driving the MRAM, it is preferable that when the first data is "1," the second data is "0," and when the first data is "0," the second data is "1."

According to another feature of an embodiment of the present invention, a method of driving the MRAM described above is provided, the method including applying a positive voltage to the word line and applying a positive voltage to the plate line and reading out data recorded in the MTJ layer by sensing an output data signal from an amplifying unit, which is coupled to the bit line.

In an MRAM according to an embodiment of the present invention, because a bit line is formed of a metal and a BJT is used, a series resistance effect caused by the resistance of a MOS transistor, and which prevents reading of a current flowing through an MTJ layer, can be minimized, thus allowing data to be precisely read from an MTJ layer. Also, an integration density is higher in an MRAM according to the present invention than in a device using a MOS transistor. Finally, by the present invention, it is possible to use an MTJ layer having a low MR ratio, which cannot be easily applied to a device having a MOS transistor.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
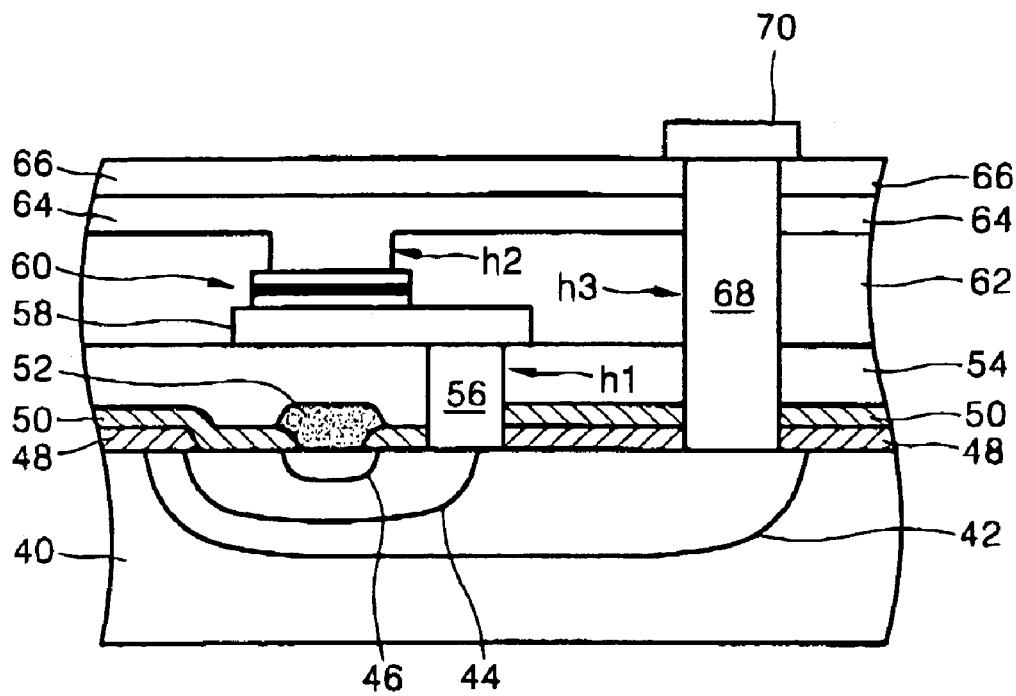
FIG. 1 illustrates a cross-sectional view of an MRAM according to an embodiment of the present invention.

Korean Patent Application No. 2002-68768, filed on Nov. 7, 2002, and entitled: "MRAM and Methods for Manufacturing and Driving the Same," is incorporated by reference herein in its entirety.

The present invention, "MRAM and Methods for Manufacturing and Driving the Same", will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the shape and thickness of layers and regions are exaggerated for clarity. It will also be understood that when a layer is referred to as being "on" or "above" another layer or substrate, it can be directly on the other layer or substrate, or intervening layers may also be present. Further, it will be understood that when a layer is referred to as being "under" or "below" another layer, it can be directly under, and one or more intervening layers may also be present. In addition, it will also be understood that when a layer is referred to as being "between" two layers, it can be the only layer between the two layers, or one or more intervening layers may also be present. The same reference numerals in different drawings represent the same element.

To begin with, an MRAM according to an embodiment of the present invention will be described with reference to FIGS. 1 and 2.

Referring to FIG. 1, an n-type first impurity region 42 is formed in a semiconductor substrate 40, to a predetermined depth, by doping with first conductive impurities, for example, phosphorus (P). The n-type first impurity region 42 is used as a collector of a bipolar junction transistor (BJT). A p-type impurity region 44 is formed in the n-type first impurity region 42 by doping with second conductive impurities, for example, boron (B). The p-type impurity region 44 is used as a base of the BJT. An $n^+$-type second impurity region 46 is formed in the p-type impurity region 44 by doping with third conductive impurities. The $n^+$-type second impurity region 46 is used as an emitter of the BJT. The third conductive impurities preferably are the same as the first conductive impurities. A first insulating layer 48 is disposed on the semiconductor substrate 40 and is used as a mask when the second conductive impurities are implanted to form the p-type impurity region 44. The first insulating layer 48 is preferably formed of a silicon oxide layer, which is thick enough to prevent the implantation of the impurity ions, but it is possible to use other materials for the first insulating layer 48. A second insulating layer 50 is disposed on the semiconductor substrate 40 so as to cover the first insulating layer 48 and is used as a mask when the third conductive impurities are implanted to form the $n^+$-type second impurity region 46. The second insulating layer 50 also is preferably formed of a silicon oxide layer, which is thick enough to prevent the implantation of the impurity ions, but it is possible to use other materials for the second insulating layer 50. The second insulating layer 50 exposes only the $n^+$-type second impurity region 46 among the impurity regions 42, 44, and 46 formed in the semiconductor substrate 40. The exposed n+-type second impurity region 46 is covered with a first conductive line 52, which is a bit line, preferably, formed of a metal.

Figure 2:
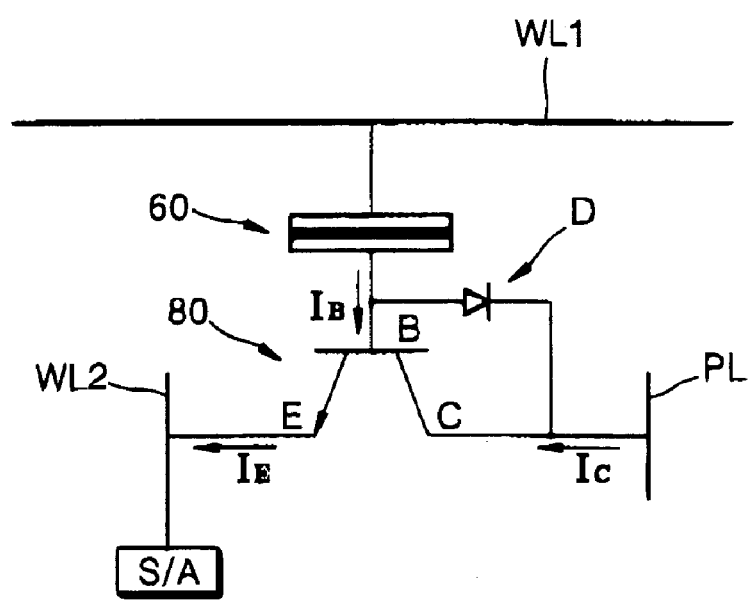
FIG. 2 illustrates an equivalent circuit diagram of the MRAM shown in FIG. 1.

Meanwhile, although not shown in FIG. 1, referring to the MRAM's equivalent circuit diagram of FIG. 2, a signal amplifying unit S/A is coupled to the first conductive line 52 in order to amplify a data signal corresponding to data "0" or "1," which is outputed via the first conductive line 52 during a 'read' operation. The signal-amplifying unit S/A is preferably a sense amplifier, but it is possible to use other elements for the signal-amplifying unit S/A as long as the elements can amplify the data signal.

The first conductive line 52 and the second insulating layer 50 are covered with a first interlayer dielectric (ILD) 54 having a planar surface. A first contact hole h1 is formed in the first ILD 54, thereby exposing a boundary region between the n-type first impurity region 42 and the p-type impurity region 44 and portions of the n-type first impurity region 42 and the p-type impurity region 44 adjacent to the boundary region. The first contact hole h1 is filled with a first conductive plug 56. A pad conductive layer 58 is formed on the first ILD 54 above the first conductive line 52 and the first conductive plug 56. The pad conductive layer 58 contacts the entire surface of the first conductive plug 56. The pad conductive layer 58 is preferably formed of a same material as the first conductive plug 56, but it is possible to use other conductive materials for the conductive plug 56. An MTJ layer 60, where data "0" or "1" is recorded, is formed on the pad conductive layer 58. The MTJ layer 60 is preferably formed over the first conductive line 52. As the MTJ layer 60 is disposed as described above, the influence of a magnetic field generated by the first conductive line 52 on the MTJ layer 60, when current flows through the first conductive line 52, may be minimized.

Next, a second ILD 62 is formed on the first ILD 54 so as to cover the pad conductive layer 58 and the MTJ layer 60. The second ILD 62 is preferably formed of the same material as the first ILD 54, but it is possible to use other insulating materials for the second ILD 62. A via hole h2 is formed in the second ILD 62 so as to expose the MTJ layer 60. A second conductive line 64 is formed on the second ILD 62 so as to fill the via hole h2. The second conductive line 64 is used as a word line.

Meanwhile, although not shown in the drawings, the second conductive line 64 may include a conductive plug for filling the via hole h2 and a conductive line being in contact with the conductive plug.

The second conductive line 64 is covered with a third ILD 66. The third ILD 66 is preferably formed of the same material as the first ILD 54 or the second ILD 62, but it is possible to use other insulating materials for the third ILD 66. A second contact hole h3 is formed in the third ILD 66 and penetrates not only the second conductive line 64, the second ILD 62 and the first ILD 54, but also the second insulating layer 50 and the first insulating layer 48 formed thereunder, so as to expose the n-type first impurity region 42 formed in the semiconductor substrate 40. The second contact hole h3 is filled with a second conductive plug 68. A plate line 70 is formed on the third ILD 66 so as to contact the entire surface of the second conductive plug 68. The second conductive plug 68 and the plate line 70 are preferably formed of the same material, but it is possible to use different materials for each of them. The BJT in the MRAM may be formed of a Schottky type junction, instead of an n-p-n type structure shown in FIG. 1.

FIG. 2 is an equivalent circuit diagram of the MRAM of FIG. 1 having the aforementioned components. Here, reference character WL1 denotes the second conductive line 64, and reference character WL2 denotes the first conductive line 52. Reference characters PL, $I_B$, $I_C$, and $I_E$ denote the plate line 70, a base current flowing through the MTJ layer 60, a collector current, and an emitter current, respectively. Also, reference characters B, C, and E denote the base, the collector, and the emitter, respectively, of BJT 80 and correspond to the p-type impurity region 44, the n-type first impurity region 42, and the n+-type second impurity region 46, respectively. Also, reference character D denotes a diode formed between the MTJ layer 60 and the plate line PL. The diode D may be formed by the first conductive plug 56, which is in contact with a portion of the base and a portion of the collector that is adjacent to the portion of the base, as shown in FIG. 1.

Hereinafter, a method for manufacturing the aforementioned MRAM will be described.

Figure 3:
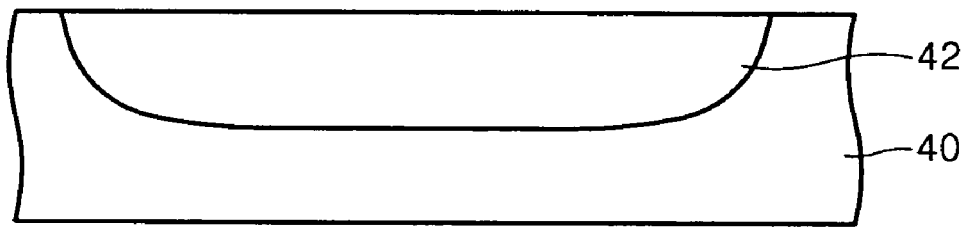
FIGS. 3 through 12 illustrate cross-sectional views of a method of manufacturing the MRAM shown in FIG. 1.

Referring to FIG. 3, impurities of a first conductivity type are implanted into a predetermined region of the semiconductor substrate 40, thereby forming the n-type first impurity region 42 as the collector of the BJT. Here, the impurities of the first conductivity type are, for example, phosphorus (P) ions.

Figure 4:
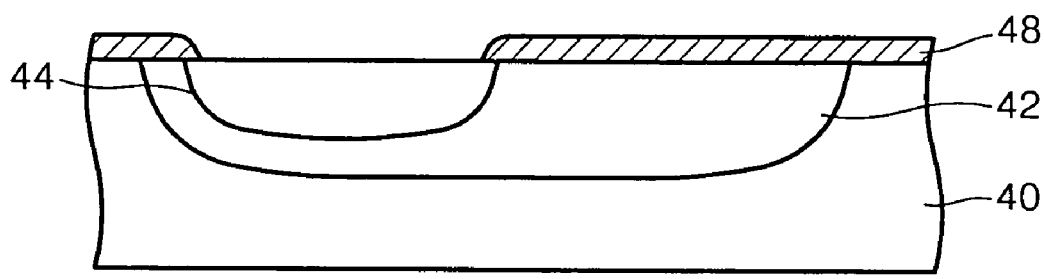

Referring to FIG. 4, the first insulating layer 48 is formed on the semiconductor substrate 40. Here, the first insulating layer 48 partially covers the n-type first impurity region 42 so as to expose a portion of the n-type first impurity region 42. By using the first insulating layer 48 as a mask, impurity ions of a second conductivity type are implanted into the exposed portion of the n-type first impurity region 42. The impurities of the second conductivity type are, for example, boron (B) ions. Thus, the p-type impurity region 44 is formed in the n-type first impurity region 42. As shown in the drawings, the p-type impurity region 44 is preferably formed to a shallower depth than the n-type first impurity region 42. Also, because the first insulating layer 48 is used as the implant mask, it is preferably formed of a material layer such as a silicon oxide layer, which is thick enough to prevent the implantation of the impurities in the masked areas.

Figure 5:
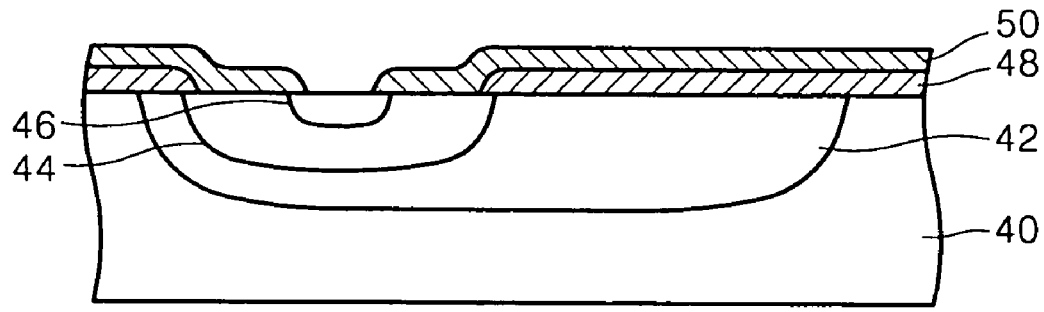

Next, as shown in FIG. 5, the n+-type second impurity region 46 is formed as the emitter of the BJT in the p-type impurity region 44 in the same manner as the p-type impurity region 44.

Specifically, the second insulating layer 50 is formed on the semiconductor substrate 40 on which the p-type impurity region 44 is formed, so as to cover the first insulating layer 48. The second insulating layer 50 is formed to partially cover the p-type impurity region 44, thereby exposing a portion of the p-type impurity region 44. Then, impurities of a third conductivity type are implanted into the exposed portion of the p-type impurity region 44 by using the second insulating layer 50 as a mask. The impurities of the third conductivity type are preferably the same as those of the first conductivity type. Thus, the n+-type second impurity region 46 is formed in the p-type impurity region 44. Here, the n+-type second impurity region 46 is preferably formed to a shallower depth than the p-type impurity region 44. The second insulating layer 50 is preferably formed of a material layer such as a silicon oxide layer, which is thick enough to prevent the implantation of the impurities of the third conductivity type into regions other than the exposed portion of the p-type impurity region 44.

Meanwhile, in the process for forming the second insulating layer 50, as shown in FIG. 5, the second insulating layer 50 is preferably formed on the semiconductor substrate 40 on which the first insulating layer 48 remains. However, it is possible to form the second insulating layer 50 on the semiconductor substrate 40 after removing the first insulating layer 48.

Figure 6:
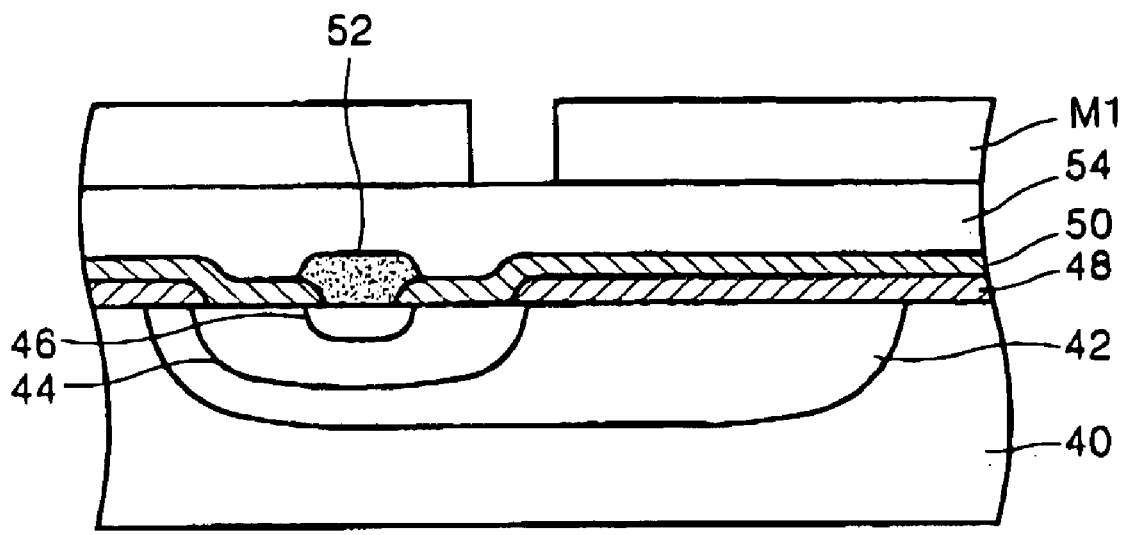
Figure 7:
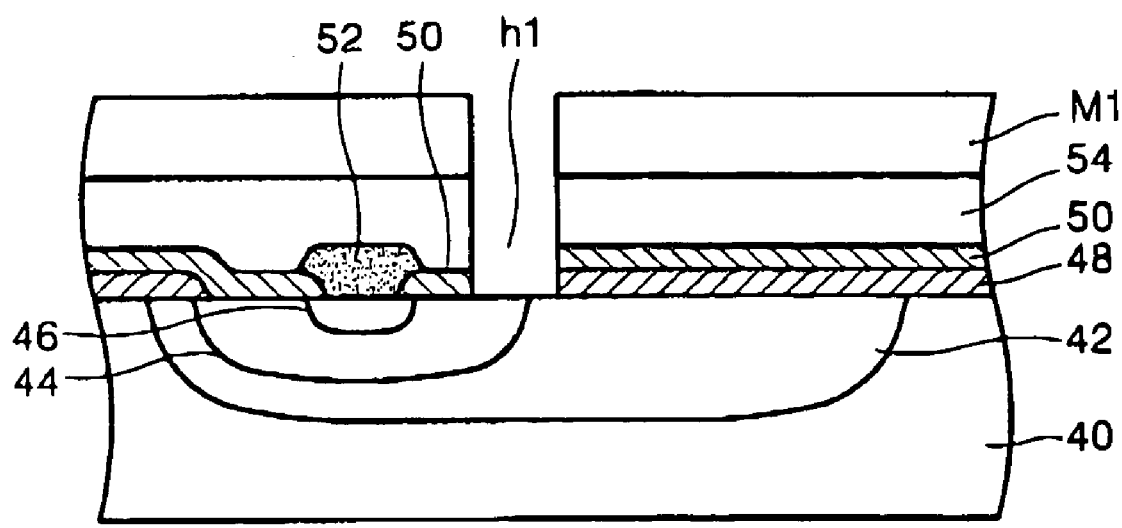

After forming the n$^+$-type second impurity region 46 as described above, as shown in FIG. 6, the first conductive line 52 is formed on the semiconductor substrate 40 so as to cover the entire surface of the n$^+$-type second impurity region 46. To maximize a magnetic field, which is generated when a current is applied to the first conductive line 52, the first conductive line 52 is preferably formed of a metal. The first conductive line 52 is used as a bit line and is formed as a line shape, which is perpendicular to the paper. The first ILD 54 is formed on the entire surface of the resultant structure where the first conductive line 52 is formed and is then planarized. A first mask M1 is formed on the planarized surface of the first ILD 54 so as to expose a portion of the first ILD 54. That is, the first mask M1, which is a photoresist pattern, is formed so as to expose a portion of the first ILD 54 which covers a boundary region between the n-type first impurity region 42 and the p-type impurity region 44 and portions of the n-type first impurity region 42 and the p-type impurity region 44 adjacent to the boundary region. After this, as shown in FIG. 7, the exposed portion of the first ILD 54, the second insulating layer 50, and the first insulating layer 48 are sequentially etched by using the first mask M1 as an etch mask. As a result, a first contact hole h1 is formed in the first ILD 54 so as to expose the boundary region between the p-type impurity region 44 and the n-type first impurity region 42 and portions of the p-type impurity region 44 and the n-type first impurity region 42 adjacent to the boundary region. Then, the first mask M1 is removed.

Figure 8:
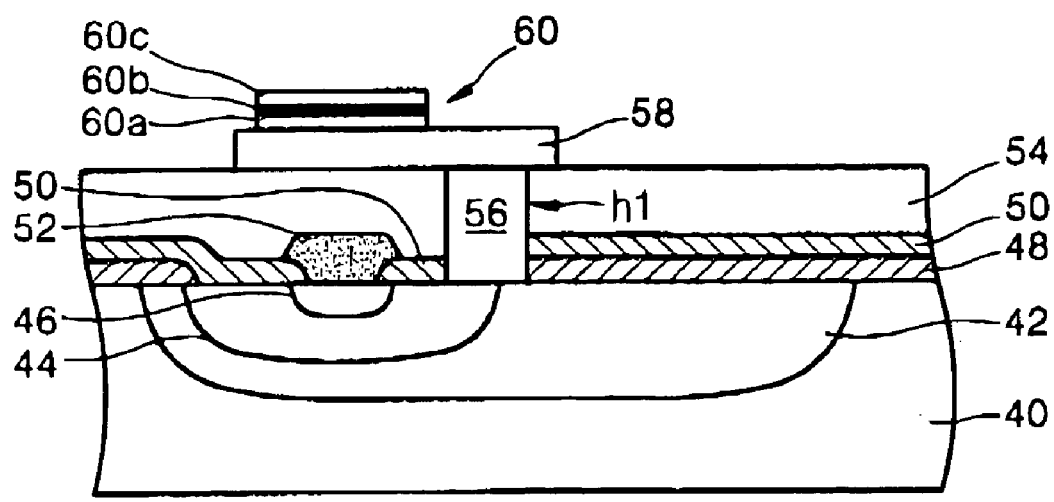

Next, as shown in FIG. 8, the first contact hole h1 is filled with the first conductive plug 56, and the pad conductive layer 58 is formed on the first ILD 54 so as to contact the entire surface of the first conductive plug 56. Here, the pad conductive layer 58 is sufficiently formed to traverse the first conductive line 52. A first ferromagnetic layer 60a, an insulating layer 60b, and a second ferromagnetic layer 60c are sequentially formed on a predetermined region of the pad conductive layer 58, which corresponds to the region above the first conductive line 52, thereby forming the MTJ layer 60. The MTJ layer 60 is coupled to the p-type impurity region 44 and the n-type impurity region 42 via the pad conductive layer 58 and the first conductive plug 56.

Figure 9:
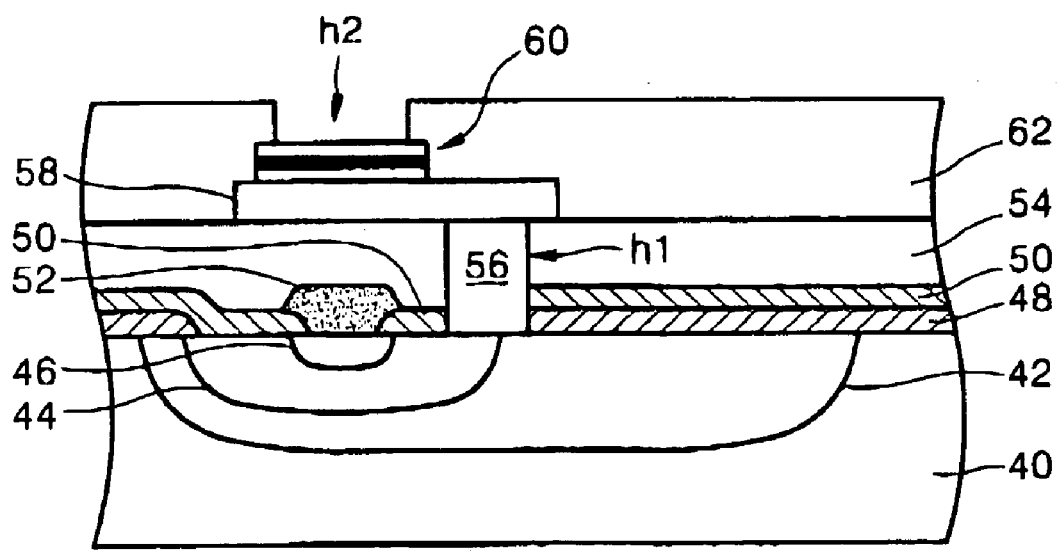

Referring to FIG. 9, the second ILD 62 is formed on the first ILD 54 so as to cover the MTJ layer 60. The second ILD 62 may be formed of the same material as the first ILD 54. A via hole h2 is formed in the second ILD 62 so as to expose the MTJ layer 60.

Figure 10:
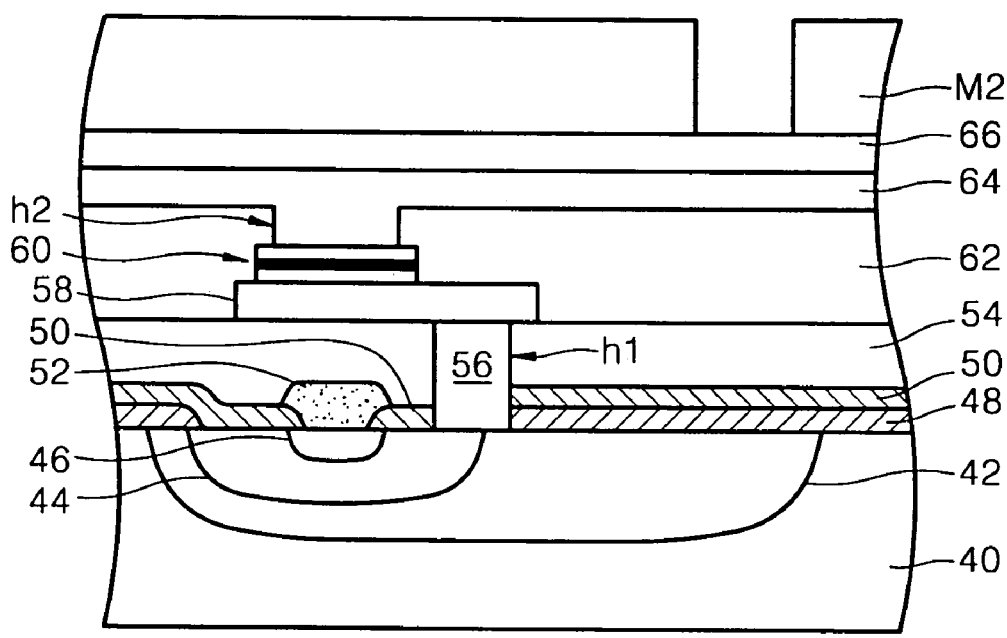

Referring to FIG. 10, a second conductive line 64 is formed on the second ILD 62 to fill the via hole h2. The second conductive line 64 is used as a word line. Thus, the second conductive line 64 is preferably formed perpendicularly to the first conductive line 52.

Meanwhile, although not shown in the drawings, the second conductive line 64 also may be formed by forming a conductive plug to fill the via hole h2 and forming a conductive line contacting the conductive plug on the second ILD 62.

Referring to FIG. 10, the third ILD 66 is formed on the second ILD 62 so as to cover the second conductive line 64. The third ILD 66 may be formed of the same material as the second ILD 62. A second mask M2 is formed on the third ILD 66 so as to expose a portion of the third ILD 66. The second mask M2, which is a photoresist pattern, is preferably formed to expose a portion of the third ILD 66, which is above a portion of the n-type first impurity region 42 and is spaced apart from the pad conductive layer 58 by a predetermined distance. The exposed portion of the third ILD 66 is etched using, for example, an anisotropic etch process, by using the second mask M2 as an etch mask. The etching process is performed until the second conductive line 64, the second ILD 62, the first ILD 54, the second insulating layer 50, and the first insulating layer 48, which are sequentially formed under the exposed portion of the third ILD 66, are sequentially removed so as to expose the portion of the n-type first impurity region 42.

Figure 11:
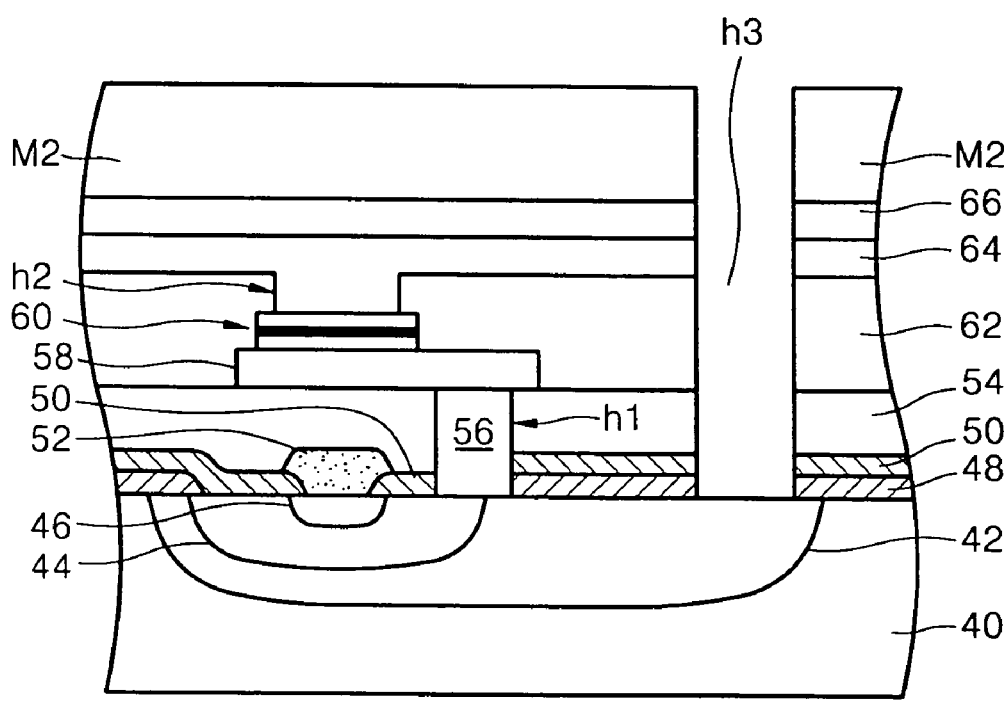

As a result, as shown in FIG. 11, the second contact hole h3 is formed in a stack which includes the third ILD 66 and material layers disposed thereunder, while exposing the portion of the n-type first impurity region 42. Then, the second mask M2 is removed.

Figure 12:
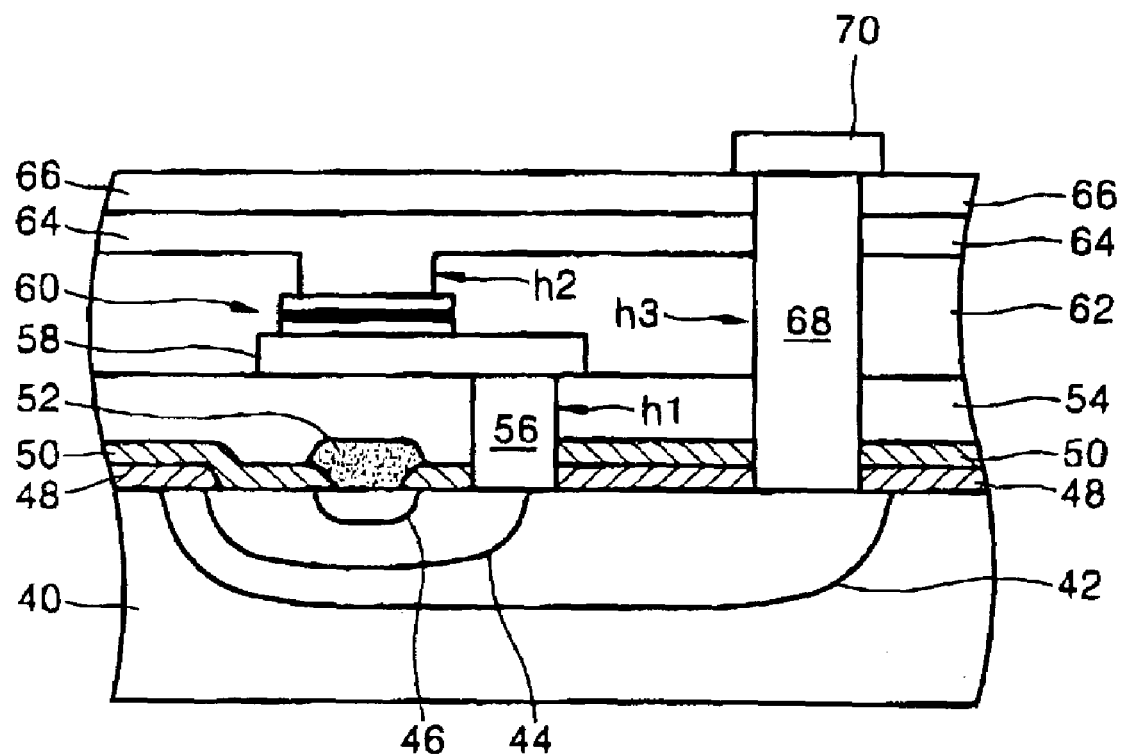

Referring to FIG. 12, the second contact hole h3 is filled with the second conductive plug 68, and then the plate line 70 is formed on the third ILD 66 so as to contact the second conductive plug 68. The plate line 70 is coupled to the collector of the BJT (the n-type first impurity region 42) via the second conductive plug 68.

A method for manufacturing the MRAM may also include forming a provision for coupling an amplifying unit S/A (FIG. 2) to the bit line 52. The amplifying unit S/A amplifies a data signal output of the bit line 52.

Hereinafter, a method of driving the MRAM according to the embodiments of the present invention will be described with reference to FIG. 1.

Here, for clarity of explanation, the first conductive line 52 is referred to as a bit line and the second conductive line 64 is referred to as a word line.

Write Operation:

A predetermined amount of current is applied to each of the word line 64 and the bit line 52. The arrangement of electronic spins, i.e., a magnetized state, in each of the first ferromagnetic layer 60a and the second ferromagnetic layer 60c of the MTJ layer 60 is determined by a magnetic field generated by the current flowing through the word line 64 and the bit line 52. Here, the magnetized state of each of the first ferromagnetic layer 60a and the second ferromagnetic layer 60c is regarded as the recording of data "1."

Next, a predetermined amount of current is applied to the word line 64 in an opposite direction to the direction in which the data "1" is recorded, and a predetermined amount of current is applied to the bit line 52 in the same direction or in an opposite direction to the direction in which the data "1" is recorded. Here, the magnetized state of each of the first ferromagnetic layer 60a and the second ferromagnetic layer 60c is regarded as the recording of data "0."

It is optional to regard the magnetized state of each of the first ferromagnetic layer 60a and the second ferromagnetic layer 60c as recording of the data "1" or "0." Therefore, it is also possible to regard the former as the recording of the data "0" and the latter as the recording of the data "1."

Read Operation:

A positive voltage is applied to each of the word line 64 and the plate line 70. Here, the strength of current flowing through the MTJ layer 60 is varied according to the state of the memory, i.e., a magnetized state of each of the first ferromagnetic layer 60a and the second ferromagnetic layer 60c of the MTJ layer 60. The current flowing through the MTJ layer 60 is amplified via the base (the p-type impurity region 44) and is sensed by the data signal-amplifying unit (S/A of FIG. 2), which is coupled to the bit line 52. The strength of the sensed current is analyzed so as to know whether the data recorded in the MTJ layer 60 is "1" or "0."

As explained so far, an MRAM according to an embodiment of the present invention includes a bit line formed of a metal and an MTJ layer coupled to a BJT. Thus, the parasitic series resistance may be minimized so that data can be precisely read out from the MTJ layer. Also, current flowing through the MTJ layer may be amplified and sensed. Accordingly, unlike an MRAM having a MOS transistor, the MRAM having a BJT of the present invention can use an MTJ layer having a low MR ratio and improved integration density.

Preferred embodiments of the present invention have been disclosed herein and, although specific terms are employed, they are used and are to be interpreted in a generic and descriptive sense only and not for purpose of limitation. For example, those of ordinary skill in the art can manufacture an MRAM by using a BJT having a Schottky junction in place of an n-p-n-type BJT as described above. Also, a first conductive plug may include two elements. For instance, the first conductive plug may include a conductive plug connecting the pad conductive layer with a portion of the base and the other conductive plug connecting the pad conductive layer with a portion of the collector. Also, a method for forming the first conductive plug may be provided. Accordingly, it will be understood by those of ordinary skill in the art that various changes in form and details may be made without departing from the spirit and scope of the present invention as set forth in the following claims.

What is claimed is:

1. An MRAM comprising:
   a semiconductor substrate;
   a bipolar junction transistor formed on the semiconductor substrate;
   a bit line coupled to an emitter of the bipolar junction transistor;
   a magnetic tunneling junction layer coupled to the bipolar junction transistor;
   a word line coupled to the magnetic tunneling junction layer;
   a plate line coupled to the bipolar junction transistor so as to be spaced apart from the magnetic tunneling junction layer; and
   an interlayer dielectric formed between components of the MRAM,
   wherein the magnetic tunneling junction layer is coupled to a base and a collector of the bipolar junction transistor, the plate line is coupled to the collector, and an amplifying unit for amplifying a signal while data is read out from the magnetic tunneling junction layer is coupled to the bit line.

2. The MRAM as claimed in claim 1, wherein the magnetic tunneling junction layer is coupled to a portion of the base and a portion of the collector that is adjacent to the portion of the base.

3. The MRAM as claimed in claim 1, wherein the magnetic tunneling junction layer is coupled to a portion of the base and a portion of the collector that is spaced apart from the portion of the base.

4. The MRAM as claimed in claim 1, further comprising a first conductive plug and a pad conductive layer disposed between the bipolar junction transistor and the magnetic tunneling junction layer, wherein the first conductive plug is coupled to the base and the collector of the bipolar junction transistor, the pad conductive layer contacts the first conductive plug, and the magnetic tunneling junction layer is formed on the pad conductive layer.

5. The MRAM as claimed in claim 2, further comprising a first conductive plug and a pad conductive layer disposed between the bipolar junction transistor and the magnetic tunneling junction layer, wherein the first conductive plug is coupled to the base and the collector cite bipolar junction transistor, the pad conductive layer contacts the first conductive plug, and the magnetic tunneling junction layer is formed on the pad conductive layer.

6. The MRAM as claimed in claim 3, further comprising a first conductive plug and a pad conductive layer disposed between the bipolar junction transistor and the magnetic tunneling junction layer, wherein the first conductive plug is coupled to the base and the collector of the bipolar junction transistor, the pad conductive layer contacts the first conductive plug, and the magnetic tunneling junction layer is formed on the pad conductive layer.

7. The MRAM as claimed in claim 4, wherein the pad conductive layer is formed to traverse the bit line, and the magnetic tunneling junction layer is formed over the bit line.

8. The MRAM as claimed in claim 5, wherein the pad conductive layer is formed to traverse the bit line, and the magnetic tunneling junction layer is formed over the bit line.

9. The MRAM as claimed in claim 6, wherein the pad conductive layer is formed to traverse the bit line, and the magnetic tunneling junction layer is formed over the bit line.

10. The MRAM as claimed in claim 1, wherein the bit line is a metal line.

11. The MRAM as claimed in claim 1, wherein the bipolar junction transistor is an n-p-n-type transistor.

12. The MRAM as claimed in claim 1, wherein the bipolar junction transistor is a Schottky junction transistor.

13. The MRAM as claimed in claim 1, wherein the amplifying unit is a sense amplifier.

14. A method for manufacturing an MRAM comprising:
    forming a bipolar junction transistor on a semiconductor substrate;
    forming a bit line on the semiconductor substrate so as to contact an emitter of the bipolar junction transistor;
    forming a magnetic tunneling junction layer on the resultant structure where the bit line is formed, so as to be coupled to the bipolar junction transistor;
    forming a word line so as to be coupled to the magnetic tunneling junction layer;
    forming a plate line so as to be spaced apart from the magnetic tunneling junction layer and coupled to the bipolar junction transistor; and
    coupling an amplifying unit, which amplifies a data signal output via the bit line, to the bit line.

15. The method as claimed in claim 14, wherein forming the bipolar junction transistor on the semiconductor substrate comprises:
    forming a collector on the substrate;
    forming a base in the collector; and
    forming the emitter in the base.

16. The method as claimed in claim 14, wherein the bit line is formed of a metal line.

17. The method as claimed in claim 15, wherein forming the magnetic tunneling junction layer on the resultant structure where the bit line is formed, so as to be coupled to the bipolar junction transistor, comprises:
    forming a first interlayer dielectric on the entre satiate surface of the resultant structure where the bit line is formed;
    forming a first contact hole in the first interlayer dielectric so as to partially expose the base and the collector;
    forming a pad conductive layer on the first interlayer dielectric so as to fill the contact hole, the pad conductive layer formed to traverse the bit line; and forming the magnetic tunneling junction layer on the pad conductive layer above the bit line.

18. The method as claimed in claim 17, wherein forming the first contact hole comprises forming a contact hole for exposing a portion of the base and a portion of the collector that is adjacent to the portion of the base.

19. The method as claimed in claim 17, wherein forming the first contact hole comprises simultaneously forming a contact hole for exposing a portion of the base and a contact hole for exposing a portion of the collector that is spaced apart from the portion of the base.

20. The method as claimed in claim 17, wherein forming the pad conductive layer comprises:
 forming a first conductive plug for filling the first contact hole; and
 forming a conductive layer on the first interlayer dielectric so as to contact the first conductive plug and to be disposed over the bit line.

21. The method as claimed in claim 20, wherein forming the magnetic tunneling junction layer on the pad conductive layer disposed over the bit line comprises:
 forming a first ferromagnetic layer;
 forming an insulating layer on the first ferromagnetic layer; and
 forming a second ferromagnetic layer on the insulating layer.

22. The method as claimed in claim 17, wherein forming the word line so as to be coupled to the magnetic tunneling junction layer comprises:
 forming a second interlayer dielectric on the first interlayer dielectric including the pad conductive layer and the magnetic tunneling junction layer,
 forming a via hole through the second interlayer dielectric so as to partially expose the tunneling junction layer; and
 forming a conductive layer on the second interlayer dielectric, wherein the conductive layer also fills the via hole.

23. The method as claimed in claim 22, wherein forming the plate line so as to be spaced apart from the magnetic tunneling junction layer and coupled to the bipolar junction transistor comprises:
 forming a third interlayer dielectric on the word line;
 forming a second contact hole through the third interlayer dielectric and all layers below the third interlayer dielectric exposing a portion of the collector away from the pad conductive layer;
 filling the second contact hole with a second conductive plug; and
 forming a plate line to contact the second conductive plug, which is filling the second contact hole.

24. A method of driving an MRAM in which a bipolar junction transistor is disposed on a semiconductor substrate, a bit line is coupled to an emitter of the bipolar junction transistor, a magnetic tunneling junction layer is coupled to the bipolar junction transistor, a word line is coupled to the magnetic tunneling junction layer, a plate line is coupled to the bipolar junction transistor so as to be spaced apart from the magnetic tunneling junction layer, and an interlayer dielectric is formed between components of the MRAM, wherein the magnetic tunneling junction layer is coupled to a base and a collector of the bipolar junction transistor, and the plate line is coupled to the collector, the method comprising:
 recording a first data by applying current to the word line and the bit line; and
 recording a second data by applying current to the word line in an opposite direction to the direction in which current is applied to the word line and the bit line when the first data is recorded, and applying current to the bit line in any direction.

25. The method as claimed in claim 24, wherein in the recording of the second data, current is applied to the bit line in an opposite direction to the direction in which current is applied to the word line and the bit line when the first data is recorded.

26. The method as claimed in claim 24, wherein in the recording of the second data, current is applied to the bit line in a same direction as the direction in which current is applied to the word line and the bit line when the first data is recorded.

27. The method as claimed in claim 24, wherein when the first data is "1," the second data is "0," and when the first data is "0," the second data is "1."

28. The method as claimed in claim 25, wherein when the first data is "1," the second data is "0," and when the first data is "0," the second data is "1."

29. The method as claimed in claim 26, wherein when the first data is "1," the second data is "0," and when the first data is "0," the second data is "1."

30. A method of driving an MRAM in which a bipolar junction transistor is disposed on a semiconductor substrate, a bit line is coupled to an emitter of the bipolar junction transistor, a magnetic tunneling junction layer is coupled to the bipolar junction transistor, a word line is coupled to the magnetic tunneling junction layer, a plate line is coupled to the bipolar junction transistor so as to be spaced apart from the magnetic tunneling junction layer, and an interlayer dielectric is formed between components of the MRAM, wherein the magnetic tunneling junction layer is coupled to a base and a collector of the bipolar junction transistor, and the plate line is coupled to the collector, the method comprising:
 applying a positive voltage to the word line and applying a positive voltage to the plate line; and
 reading out data recorded in the magnetic tunneling junction layer by sensing an output data signal from an amplifying unit, which is coupled to the bit line.

* * * * *